United States Patent [19]
Feenstra et al.

[11] Patent Number: 5,972,847
[45] Date of Patent: Oct. 26, 1999

[54] METHOD FOR MAKING HIGH-CRITICAL-CURRENT-DENSITY $YBA_2CU_3O_7$ SUPERCONDUCTING LAYERS ON METALLIC SUBSTRATES

[75] Inventors: Roeland Feenstra, Knoxville; David Christen, Oak Ridge; Mariappan Paranthaman, Knoxville, all of Tenn.

[73] Assignee: Lockheed Martin Energy, Oak Ridge, Tenn.

[21] Appl. No.: 09/014,481

[22] Filed: Jan. 28, 1998

[51] Int. Cl.$^6$ ............................... B05D 5/12; C23C 14/24
[52] U.S. Cl. .......................... 505/473; 505/500; 505/238; 505/732; 505/742
[58] Field of Search ................................. 505/473, 238, 505/500, 742, 732; 427/62

[56] References Cited

PUBLICATIONS

Mankiewich et al, MRS Symp. Proc. vol. 99 (1988) pp. 119–125, No month.

Yee et al, AIP Conference Proceedings No. 165 (1988) pp. 132–140, No month.

Mankiewich, et al., "High Critical–Current Density $Ba_2YCu_3O_7$ Thin Films Produced By Coevaporation of Y, Cu, $BaF_2$", *Mat. Res. Soc. Symp. Proc.* 99:119–125 (1988).

He et al, Physica C 275 (1997) pp. 155–161.

Skofronick et al, J. Appl. Phys. 76(8), Oct. 1994, pp. 4753–4760.

Chan, et al., "Effect of the Post–Deposition Processing Ambient on the Preparation of Superconducting $Yba_2Cu_3O_{7-x}$ Coevaporated Thin Films Using a $BaF_2$", *Appl. Phys Lett.* 53 (15): 1443–1445 (1988).

Feenstra, et al, "Effect of Oxygen Pressure on the Synthesis of $Yba_2Cu_3O_{7-x}$ Thin Films by Post–Deposition Annealing", *J. Appl. Phys.* 69 (9): 6569–6585 (1991).

Mankiewich, et al., "Reproducible Technique for Fabrication of Thin Films of High Transition Temperature Superconductors", *App. Phys. Lett.* 51 (21): 1753–1755 (1987).

*Primary Examiner*—Roy V. King
*Attorney, Agent, or Firm*—Quarles & Brady LLP

[57] ABSTRACT

A method is disclosed for fabricating $YBa_2Cu_3O_7$ superconductor layers with the capability of carrying large superconducting currents on a metallic tape (substrate) supplied with a biaxially textured oxide buffer layer. The method represents a simplification of previously established techniques and provides processing requirements compatible with scale-up to long wire (tape) lengths and high processing speeds. This simplification has been realized by employing the $BaF_2$ method to grow a $YBa_2Cu_3O_7$ film on a metallic substrate having a biaxially textured oxide buffer layer.

2 Claims, No Drawings

METHOD FOR MAKING HIGH-CRITICAL-CURRENT-DENSITY $YBA_2CU_3O_7$ SUPERCONDUCTING LAYERS ON METALLIC SUBSTRATES

STATEMENT REGARDING FEDERALLY SPONSORED RESEARCH OR DEVELOPMENT

The U.S. Government has rights in this invention pursuant to contract number DE-AC O5-96OR22464 between the United States Department of Energy (DOE) and Lockheed Martin Energy Research Corporation. The invention was funded by the Superconductivity Program for Electric Power Systems, DOE Office of Energy Efficiency and Renewable Energy, and the DOE Office of Energy Research.

CROSS-REFERENCE TO RELATED APPLICATIONS

Not applicable.

BACKGROUND OF THE INVENTION

Recent advances in the design of superconductors have allowed the production of vastly improved high critical current density superconductors. For example, the Re—Ba—Cu—O (abbreviated ReBCO; Re denotes a rare earth metal or Y) family of superconductors have much higher intrinsic limits and can be used in high magnetic fields at relatively high temperatures (77K). These superconductors have been shown to possess high critical current densities ($J_c$) at high temperatures when fabricated as single crystals or in essentially single-crystal form as epitaxial films on single crystal substrates such as $SrTiO_3$ and $LaAlO_3$. However, these superconductors have proven intractable to existing ceramics and materials processing techniques to the formation of long lengths of conductor having $J_c$'s comparable to epitaxial films.

It has been demonstrated that in ReBCO superconductors, a biaxial texture is required to obtain high transport critical current densities. Texturing may be achieved by deposition of the ReBCO film on a biaxially textured, non-superconducting oxide buffer layer which is first deposited using ion-beam assisted deposition (IBAD) or inclined substrate deposition (ISD). The IBAD and ISD both tend to be slow, expensive processes that are not amenable for scale up to produce long lengths required for many applications. A method involving the formation of superconductor film on a biaxially textured metallic substrate is disclosed in U.S. patent application Ser. No. 08/419,583. This method is more amenable to producing long lengths of superconductors, which have applications in the development of superconducting current leads, windings for high-field magnets and motors, transmission lines, and other electrical conductor applications.

$YBa_2Cu_3O_7$ (YBCO) is an important superconductor for the development of articles requiring long lengths of superconductors. One method for manufacturing a superconducting wire or tape involves the deposition of a YBCO film on a metallic substrate. Superconducting YBCO has been deposited on polycrystalline metals in which the YBCO is c-axis oriented, but not aligned in-plane. However, in order to carry high electrical currents and remain superconducting, the YBCO films must be biaxially textured, preferably c-axis oriented, with effectively no large-angle grain boundaries, which reduce the current carrying capability of the material. YBCO films deposited on polycrystalline metal substrates do not generally meet these criteria.

The epitaxial growth of a YBCO film on a substrate may be achieved by a carefully controlled, single step process requiring the simultaneous application, in the presence of oxygen, of all three metal constituents (Y, Ba, and Cu) to a heated substrate. Another method for forming a YBCO film is known as the $BaF_2$ method (Mankiewich, et. al *Appl. Phys. Lett* 51:1753–1755, 1987). This method is a two step process involving a deposition step and an annealing step. In a deposition step, the Y, Cu, and Ba (supplied as $BaF_2$) are applied to a substrate, which need not be heated, to form a precursor layer. The rates of deposition of each constituent need not be carefully controlled and oxygen need not be supplied. Following deposition, the epitaxial YBCO structure is formed by annealing at temperatures of about 650–850° C. This method has been successfully employed only in combination with certain specifically matched, single crystal substrates, e.g. $SrTiO_3$. However, these materials are not suitable for the manufacture of long lengths of superconductors. What is needed in the art is a method for making high critical current density $YBa_2Cu_3O_7$ superconducting layers on metallic substrates.

BRIEF DESCRIPTION OF THE INVENTION

It is an object of the present invention to provide a method for making a high-critical-density superconducting tapes that can be used in the manufacture of articles requiring long lengths of superconducting materials.

The present invention is a method for making a high critical current density $YBa_2Cu_3O_7$ superconducting layer on a metallic substrate.

The present invention is also a method for making a high critical current density $ReBa_2Cu_3O_7$ superconducting layer on a metallic substrate, wherein Re is a rare earth element selected from the group consisting of members of the La-series (La, Nd, Sm, etc.).

The present invention is also a method for making a high critical current density $YBa_2CU_3O_7/ReBa_2Cu_3O_7$ superconducting layer on a metallic substrate, wherein Re is a rare earth element selected from the group consisting of members of the La-series (La, Nd, Sm, etc.), and wherein the ratio of $YBa_2Cu_3O_7:ReBa_2Cu_3O_7$ is in the range of about 0:1 to 1:0.

Other objects, features, and advantages of the present invention will become apparent upon review of the specification and claims.

DETAILED DESCRIPTION OF THE INVENTION

The present invention is a method for making a high critical current density $YBa_2Cu_3O_7$ superconducting layer on a metallic substrate comprising the steps of: (a) providing a metallic substrate having a biaxially textured, compatible buffer layer; (b) depositing a precursor film on the buffer layer by delivering yttrium (Y), copper (Cu), and $BaF_2$ onto the buffer layer; (c) annealing the precursor film to form a superconducting $YBa_2Cu_3O_7$ structure by heating the film to a sufficient temperature in the presence of a suitable gas mixture for a sufficient time to allow formation of the superconducting $YBa_2Cu_3O_7$ structure; and (d) heating the superconducting $YBa_2Cu_3O_7$ structure in pure oxygen to a sufficient temperature and for a sufficient time to increase the oxygen concentration in the $YBa_2Cu_3O_7$ structure.

As described in detail in the examples below, a metallic substrate having a biaxially textured, compatible buffer layer was made by growing an oxide buffer layer on a biaxially textured metallic tape, the tape having been textured by the RABiTS (rolling assisted biaxially textured substrate) method disclosed in U.S. patent application Ser. No. 08/419,583, filed Apr. 10 1995, now U.S. Pat. No. 5,741,377, which is incorporated by reference herein. By this method, the textured metallic tape serves as a template for the growth of the buffer layer, and the crystalline texture of the metallic film is imparted to the buffer layer. However, it is reasonably expected that a metallic substrate having a biaxially textured buffer layer produced by any other method, e.g. IBAD (We et al., *Appl. Phys. Lett.* 67: 2397, 1995) or ISD (K. Hasegawa, *Proc. ISS'96, Sapporo, Japan, Adv. in Superconductivity* IX, Vol. II.), could be used in the practice of the present invention. The metallic tape used in the examples below was a Ni tape. It is anticipated that other metals, such as Cu, Al, Fe and Ag, are suitable for producing tape for use in superconductors and could be used in the present invention.

By a "compatible buffer layer" it is meant a buffer layer that will allow the deposition of a superconducting layer on a textured metallic substrate, the superconducting layer having a superconducting transition temperature of greater than 85 K and a critical current density of at least about 100,000 A/cm$^2$. As described in the examples below, a buffer layer comprising $CeO_2$/Yttrium stabilized zirconia (YSZ)/$CeO_2$ is a compatible buffer layer for use with a Ni metallic substrate and a $YBa_2Cu_3O_7$ superconducting layer.

Factors that can affect the suitability of a buffer layer for use in the practice of the present invention include the diffusion of chemical constituents between the various layers and the chemical interaction between the chemical constituents that make up the superconducting, buffer, and metallic layers. It is well within the ability of one in the art to select suitable buffer layers such as YSZ, $CeO_2$, $Y_2O_3$, MgO, TiN, $ZrO_2$, and $SrTiO_3$, for use in combination with particular superconducting and metallic layers in the practice of this invention.

In the examples below, the sublayers of the buffer layer were grown using electron-beam evaporation ($CeO_2$ layers) and a sputtering technique (YSZ). The mode of depositing the layers is not critical to the invention and it is therefore reasonably expected that any suitable deposition technique, such as vapor deposition, sol-gel, electrodeposition, etc., could be successfully employed in the practice of the present invention.

The $YBa_2Cu_3O_7$ superconducting layer of the present invention is formed by the $BaF_2$ method. (Mankiewich et al., *Appl. Phys. Lett.* 51:1753, 1987; Mankiewich et al., *Mater. Res. Soc. Symp. Proc.* 99:119, 1988; Chan et al., *Appl. Phys. Lett.* 53:1443, 1988; and Feenstra et al., *J. Appl. Phys.* 69: 6569, 1991). The disclosures of these references are incorporated by reference. The $BaF_2$ method is a two step process involving the formation of a precursor film and annealing the precursor film under suitable conditions to form a superconducting $YBa_2Cu_3O_7$ structure.

In the examples below, the precursor film was formed by co-evaporation of Cu-metal, Y-metal, and $BaF_2$ using three electron-beam guns. The $BaF_2$ method depends upon the incorporation into the precursor film of a sufficient amount of fluorine to prevent the spontaneous reaction with ambient air and to aid in the epitaxial growth process during the post deposition anneal. Bonding of F to Ba prevents Ba from reacting with water vapor and carbon dioxide upon exposure to ambient air. It is therefore essential that BaF is stable and does not undergo decomposition during delivery from the $BaF_2$ source to the film. Suitable techniques for the deposition of $BaF_2$ include physical vapor deposition techniques such as electron-beam or thermal evaporation, or any deposition technique that does not cause excessive decomposition of $BaF_2$.

In the examples below, Y and Cu were supplied as Y-metal and Cu-metal. However, it is anticipated that Y may be supplied as $YF_3$ and CuF to obtain an epitaxial $YBa_2CU_3O_7$ film having properties comparable to those of films derived from Y-metal, Cu-metal, and $BaF_2$. Therefore, deposition of any combination of $BaF_2$, Y-metal, $YF_3$, Cu-metal, and CuF is suitable for the practice of the present invention.

The precursor film in the examples was formed on a metallic substrate heated to a temperature from about 25° C. and 100° C. Deposition of the precursor film on a substrate heated to a temperature of 400° C. or higher results in undesirable grain formation within the precursor film. The precursor film may be formed on a substrate heated to a temperature of below 400° C. However, excellent $YBa_2Cu_3O_7$ films have been obtained from precursor films deposited at room temperature. Suitable temperature for the post deposition anneal is one that allows epitaxial growth in the most favorable $YBa_2Cu_3O_7$ crystal orientation (with the c-axis perpendicular to the substrate) and minimizes the thermal budget. The temperature and duration of the anneal should be minimized to prevent adverse reactions between the sublayers of the oxide buffer layer, the buffer layer and the metal tape, and the buffer layer and the $YBa_2Cu_3O_7$ layer. An annealing temperature in the range of about 600° C. to about 850° C. for about 0.1 to 100 hours is suitable for the practice of the present invention. The oxygen concentration should be maintained in the range of about 10–1000 ppm. The presence of a small amount of water vapor (from about 0.5%–30% of 1 atm) is essential, because water vapor controls the dissociation of $BaF_2$ which is essential for the nucleation of the YBCO structure.

Following the post deposition anneal, the $YBa_2Cu_3O_7$ film is heated in pure oxygen at a pressure of 1 atm and at a temperature of from about 400–500° C. for approximately 30 min. This step increases the oxygen concentration in the $YBa_2Cu_3O_7$ film to ensure acceptable electrical characteristics.

The examples below demonstrate that an excellent superconducting $YBa_2Cu_3O_7$ layer can be formed on a metallic substrate using the present invention. It is reasonably expected that the present invention could be successfully employed in the formation of a superconducting $ReBa_2Cu_3O_7$ layer on a metallic substrate. It is envisioned that a superconducting layer containing both $ReBa_2Cu_3O_7$ and $YBa_2Cu_3O_7$ may also be formed on a metallic substrate using the method of the present invention. It is expected that the ratio of $YBa_2Cu_3O_7$ to $ReBa_2Cu_3O_7$ in a superconducting layer may range from about 0:1 to 1:0.

EXAMPLES

Formation of a Metallic Substrate With Textured Buffer Layer

The substrate consists of a pure Ni tape, rolled and annealed to obtain a biaxial surface texture according to the RABiTS method disclosed in U.S. patent application Ser. No. 08/419,583.

An oxide buffer layer consisting of three sublayers was epitaxially grown on the biaxially textured Ni tape by reactive evaporation ($CeO_2$:ceria) and a sputtering technique (YSZ:yttrium stabilized zirconia). First, a thin $CeO_2$ layer of approximately 20–40 nm was grown by electron-beam evaporation of Ce metal in an environment which contains forming gas (argon+hydrogen 4%) and (residual) water vapor. During this deposition, the Ni tape is heated to 625° C. The second layer is YSZ, grown by sputtering in a forming gas background. The substrate temperature during deposition is 700° C. The thickness of the YSZ layer was about 700–1200 nm. A second $CeO_2$ layer was deposited on the YSZ layer using the same technique and conditions as used for the first layer. The thickness of the second $CeO_2$ layer was about 20–40 nm. Thus, the sequence buffer layer/substrate is $CeO_2$/YSZ/$CeO_2$/Ni (RABiTS)

Following the deposition of the buffer layer onto the metallic substrate, the substrate was annealed in a furnace prior to deposition of the YBCO precursor film. The anneal was performed for 30 min. at 650° C. in a flowing gas which contains 260 ppm oxygen.

Formation of the YBCO Film on the Metallic Substrate

The $YBa_2CU_3O_7$ layer was grown on the biaxially textured, buffered substrate using the two-step $BaF_2$ process. First, a precursor film was deposited on the substrate by co-evaporation of Cu-metal, Y-metal, and $BaF_2$ using three electron-beam guns. The rates at which the electron-beam guns were operated was controlled to provide a mix of the metallic constituents according to the preferred composition. During this deposition the vacuum chamber was kept at a nominal vacuum ($1-5 \times 10^{-6}$ Torr) No gas is admitted to the chamber. The substrate was heated to a temperature between 25 and 100° C. The precursor film was about 300–350 nm in thickness. Under these conditions, the precursor film is amorphous or microcrystalline according to results of x-ray diffraction, and insulating. It is assumed that the film consists of a homogeneous mixture of Y, Cu, and $BaF_2$ with an unknown, variable amount of oxygen.

The second step of the $BaF_2$ method involved annealing the precursor film. The time at which the annealing step is conducted is not critical; therefore, the precursor films may be stored and the annealing step conducted in batches. In the annealing step, the precursor film is heated in a furnace in the presence of a suitable gas mixture, which causes increased oxidation, the dissociation of the $BaF_2$, and the formation of the epitaxial $YBa_2Cu_3O_7$ structure. These steps occur virtually simultaneously and are controlled by the annealing conditions.

High quality YBCO films were obtained on the buffered metallic substrate by using a relatively low annealing temperature of 740° C. The anneal was performed in a flowing gas mixture with total pressure of 1 atm, consisting of an inert carrier (nitrogen or argon) and small amounts of oxygen (260 ppm) and water vapor (2.6%). The duration of the anneal (hold) at 740° C was one hour. Following this principle heat treatment, the sample was cooled and the gas mixture is changed to pure oxygen (1 atm). An additional anneal of 0.5 hr is performed in oxygen at 500° C. to optimize the oxygen concentration in the $YBa_2Cu_3O_7$ film. Following this anneal, the film is slowly cooled to room temperature.

Properties of $YBa_2Cu_3O_7$ Films

The $YBa_2Cu_3O_7$ films prepared as described above are in epitaxial registry with the buffered metallic tape according to expected crystal axes alignments. The films are metallic with resistivities of about 300 $\mu\Omega$cm at room temperature and 100 $\mu\Omega$cm at 100 K. The superconducting transition temperature is larger than 85 K. Critical current densities at 77 K are in excess of 100,000 $A/cm^2$ without an applied magnetic field and >10,000 $A/cm^2$ in a field of 1 T. These data are benchmarks of high-quality epitaxial YBCO films.

A slight reaction between the YBCO and top $CeO_2$ layer was typically observed, presumably due to the formation of a barium-cerium-oxide. The formation of this reaction layer was sufficiently minimized under the chosen processing conditions to allow the fabrication of a high-quality superconducting film.

It is important that the sublayers of the oxide buffer layer of the metallic substrate be structurally compatible and stable, and that the topmost sublayer does not have a strong inclination for reacting with the YBCO layer under the conditions employed during the fabrication of the superconductor. For example, high-quality YBCO layers were obtained on a buffered metallic substrate comprising YSZ/$CeO_2$/Ni(metal) using pulsed laser ablation (U.S. patent application Ser. No. 08/419,583. However, this architecture is unsuitable when the YBCO layer is formed by the $BaF_2$ method, because of a strong affinity of YSZ with the YBCO during the post-deposition anneal. The insertion of a $CeO_2$ cap-layer eliminates the reactivity with YSZ, giving as the preferred layer sequence: $CeO_2$/YSZ/$CeO_2$/Ni(metal).

Elimination of the bottom $CeO_2$ layer was found to be unsatisfactory because the desired texture was not obtained.

Elimination of the central YSZ layer, which would simplify the structure to a single $CeO_2$ layer, appears to be precluded because of mechanical complications (formation of cracks) or excessive oxidation of the underlying metal tape. Thus, a minimum thickness of the YSZ layer of 500–700 nm has been inferred. While the $CeO_2$ cap-layer suppresses the reaction of the YBCO with the YSZ, it was found that the $CeO_2$ itself is not completely inert with respect to the YBCO either. However, this reaction appears to be more readily controlled than the reaction with YSZ. It has been established that the $CeO_2$ layer needs to be relatively thin (20–40 nm) and should be grown at a temperature between 500 and 700° C. Furthermore, the YBCO properties are significantly improved if, following completion of the buffer layer growth and prior to deposition of the YBCO precursor film, the substrate (metal-tape/buffer-layer) is annealed for 30 minutes at a temperature of 600–750° C. in a flowing gas mixture at 1.0 atm total pressure containing 200–300 ppm oxygen. The microscopic origin of this improvement and possible relation with the buffer layer growth conditions is presently not understood.

It was found that strict control during the formation of the precursor film is not required. Temporary deviations in the concentration of at least 30% occurred during the deposition and the final (total) composition deviated from the preferred composition in $YBa_2Cu_3O_7$ often by as much as 20%. These deviations had relatively little effect on the electrical properties of the films. Presumably, this is because long-range diffusion processes during the post-deposition anneal reduce compositional gradients in the precursor film. These effects provide a mechanism for compensating temporary fluctuations of the deposition process. By contrast, in single-step processes, the YBCO structure is formed essentially simultaneous with deposition. Compositional fluctuations of greater than a few percent produce extraneous phases that may degrade the properties of the YBCO layer. The relaxed constraints of the $BaF_2$ method are expected to be especially beneficial for deposition processes which involve the control of three separate sources. This includes the use of well-established evaporative techniques such as electron-beam or thermal evaporation.

There is no intrinsic limit to the deposition rate used to form the precursor film. Typically, film structures become more disordered when the deposition rate is enhanced. Because the primary goal of the first step of the $BaF_2$ method is simply to accumulate sufficient material on the substrate, high deposition rates do not have a negative impact on the final result. In contrast, in single-step processes the maximum deposition rate is limited by the inherent growth rate of epitaxial YBCO.

It is noteworthy that during the fabrication of the buffer layer, the $CeO_2$ and YSZ layers could be grown in separate vacuum chambers and exposed to air during intermediate transport without adversely affecting the properties of the finished product.

The present invention is not limited to the exemplified embodiment, but is intended to encompass all such modifications and variations as come within the scope of the following claims.

We claim:

1. A method for preparing a high critical current density $ReBa_2Cu_3O_7$ superconducting layer on a metallic substrate, wherein Re denotes a rare earth metal, comprising the steps of:

(a) providing the metallic substrate, said substrate having a biaxially textured buffer layer;

(b) depositing a precursor film on the buffer layer by delivering Cu, $BaF_2$, and at least one of the group consisting of: Y; and a rare earth metal selected from the La-series, onto the buffer layer;

(c) annealing the precursor film to form a superconducting $ReBa_2Cu_3O_7$ structure by heating the film to a sufficient temperature in the presence of a suitable gas mixture for a sufficient time to allow formation of the superconducting $ReBa_2Cu_3O_7$ structure; and (d) heating the film of step c in oxygen to a sufficient temperature and for a sufficient time to increase the oxygen concentration in the $ReBa_2Cu_3O_7$ structure so that said $ReBa_2Cu_3O_7$ structure is characterized by a critical current density of at least 100,000 $A/cm^2$ at 77 K and 0T.

2. Method of claim 1 wherein the buffer layer comprises a first $CeO_2$ layer deposited on the metallic substrate, a yttrium stabilized zirconia deposited on the first $CeO_2$ layer, and a second $CeO_2$ layer deposited on the yttrium stabilized zirconia layer.

* * * * *